US007045997B2

(12) United States Patent
Yokotani et al.

(10) Patent No.: US 7,045,997 B2
(45) Date of Patent: May 16, 2006

(54) MAGNETIC DETECTION APPARATUS

(75) Inventors: Masahiro Yokotani, Tokyo (JP); Izuru Shinjo, Tokyo (JP); Naohiro Mishiro, Tokyo (JP); Naoki Hiraoka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 84 days.

(21) Appl. No.: 10/705,959

(22) Filed: Nov. 13, 2003

(65) Prior Publication Data

US 2004/0095130 A1 May 20, 2004

Related U.S. Application Data

(63) Continuation-in-part of application No. 10/308,111, filed on Dec. 3, 2002, now abandoned.

(30) Foreign Application Priority Data

May 19, 2003 (JP) ............................ 2003-140209

(51) Int. Cl.
*G01B 7/30* (2006.01)

(52) U.S. Cl. ............................ 324/207.21; 324/207.25

(58) Field of Classification Search ........... 324/207.21, 324/207.25, 165; 338/32 R, 32 H; 340/672
See application file for complete search history.

(56) References Cited

U.S. PATENT DOCUMENTS 4,628,259 A 12/1986 Takahashi et al.
5,450,009 A 9/1995 Murakami
6,046,584 A * 4/2000 Nakane et al. ......... 324/207.22
6,107,793 A * 8/2000 Yokotani et al. ....... 324/207.21
6,194,893 B1 * 2/2001 Yokotani et al. ....... 324/207.21
6,528,992 B1 * 3/2003 Shinjo et al. .......... 324/207.21
6,630,821 B1 * 10/2003 Shinjo et al. .......... 324/207.21

FOREIGN PATENT DOCUMENTS

DE 198 50 460 A 10/1999
JP 58-096212 A 6/1983
JP 11-304413 A 11/1999

* cited by examiner

*Primary Examiner*—Bot Ledynh
*Assistant Examiner*—Reena Aurora
(74) *Attorney, Agent, or Firm*—Sughrue Mion, PLLC

(57) ABSTRACT

A magnetic detection apparatus can accurately detect the rotational position of a magnetic moving member even when intervals between adjacent teeth formed thereon and the circumferential width of each tooth itself are both small and when an opposing distance between the magnetic moving member and first and second magnetoresistive segments is large. A processing circuit is arranged apart from the magnetic moving member on a plane thereof, which is formed on its periphery with the teeth. The processing circuit has a bridge circuit including the first magnetoresistive segment and the second magnetoresistive segment. A magnet applies a magnetic field to the first and second magnetoresistive segments, and to the magnetic moving member in a direction of an axis of rotation thereof. The second magnetoelectric conversion element is arranged substantially on a center line passing through the center of the magnet on a line in opposition to the magnetic moving member when viewed along the direction of the axis of rotation of the magnetic moving member, so that a differential output can be obtained from the outputs of the first magnetoelectric conversion element and the second magnetoelectric conversion element.

15 Claims, 16 Drawing Sheets

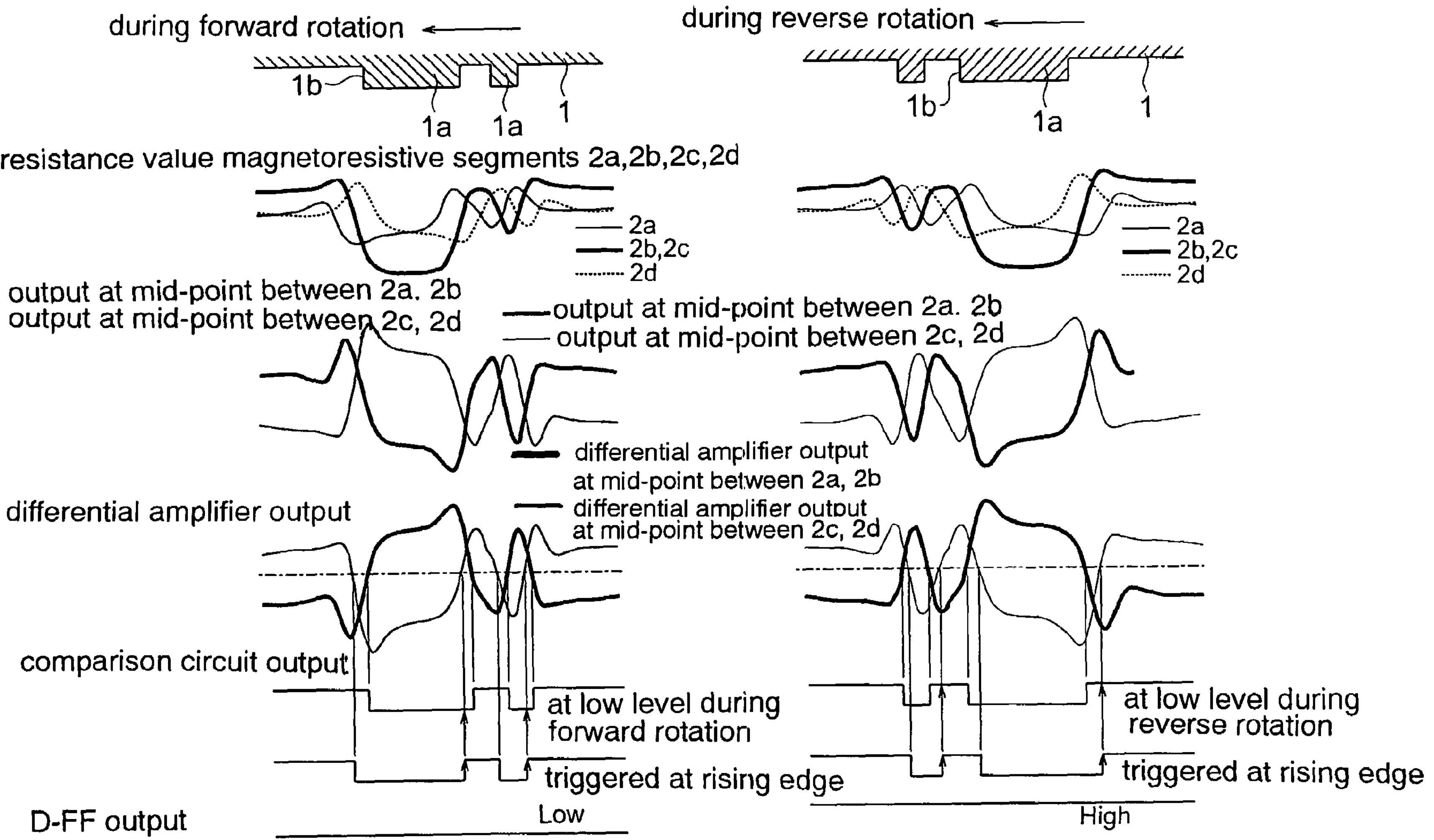
FIG. 12
during forward rotation
during reverse rotation
1b
1a
1a
1
1b
1a
1
resistance value magnetoresistive segments 2a,2b,2c,2d
2a
2b,2c
2d
2a
2b,2c
2d
output at mid-point between 2a. 2b
output at mid-point between 2c, 2d
output at mid-point between 2a. 2b
output at mid-point between 2c, 2d
differential amplifier output at mid-point between 2a, 2b
differential amplifier output at mid-point between 2c, 2d
differential amplifier output
comparison circuit output
at low level during forward rotation
at low level during reverse rotation
triggered at rising edge
triggered at rising edge
D-FF output
Low
High FIG. 15
PRIOR ART
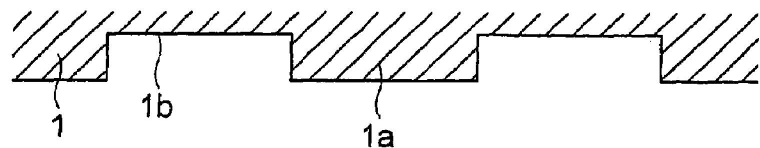
resistance value of magnetoresistive segment 2a
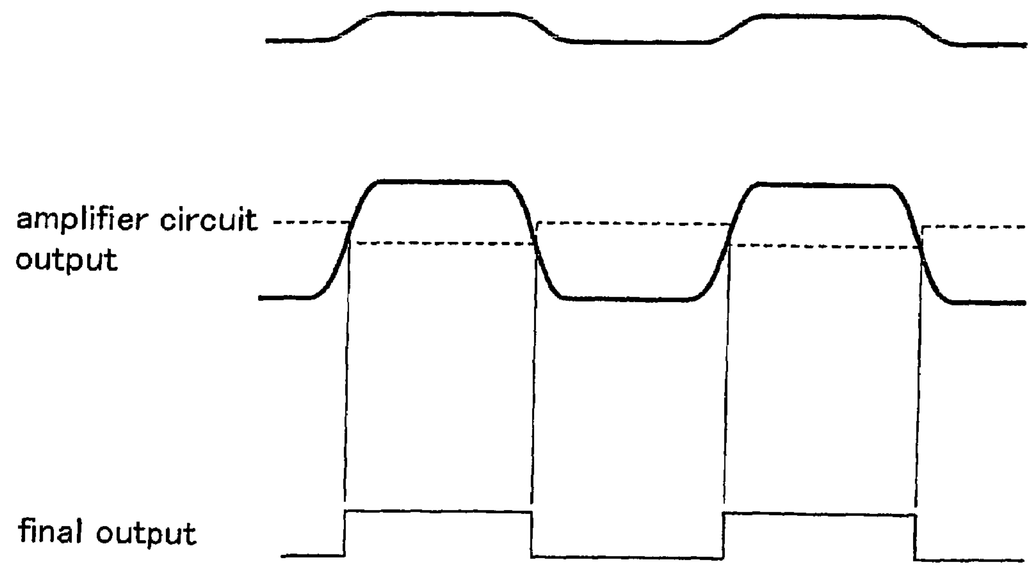

MAGNETIC DETECTION APPARATUS

This is a Continuation-In-Part of application Ser. No. 10/308,111 filed Dec. 3, 2002 now abandoned; the disclosure of which is incorporated herein by reference.

BACKGROUND OF THE INVENTION

1. Field of the Invention

The present invention relates to a magnetic detection apparatus for detecting the rotational position of a magnetic moving member that is formed on its periphery with teeth and rotates in a circumferential direction, for example.

2. Description of the Related Art

FIG. 13(*a*) is a perspective view of a known magnetic detection apparatus. FIG. 13(*b*) is a partial plan view of the magnetic detection apparatus of FIG. 13(*a*). FIG. 14 is an electric circuit diagram of the known magnetic detection apparatus. FIG. 15 shows operational waveform diagrams of the known magnetic detection apparatus.

The magnetic detection apparatus includes: a processing circuit 20 arranged apart from a magnetic moving member 1 on a plane thereof, which is formed on its periphery with teeth 1*a* and rotates around an axis of rotation or rotation shaft 4 in a circumferential direction, the processing circuit 20 having a bridge circuit in the form of a magnetoelectric conversion element composed of a magnetoresistive segment 2*a* and a fixed resistor 12*b*, another bridge circuit composed of fixed resistors 12*c*, 12*d*; and a magnet 3 that applies a magnetic field to the magnetoresistive segment 2*a* and also applies a magnetic field to the magnetic moving member 1 in the direction of the axis of rotation thereof. In addition, the processing circuit 20 incorporates therein an amplifier circuit 13, which amplifies a signal whose voltage is varied depending on a change in the resistance of the magnetoresistive segment 2*a*, a comparison circuit 14 and an output circuit 15.

With the magnetic detection apparatus as constructed above, the magnetic moving member 1 is caused to rotate in synchronization with the rotation of the rotation shaft 4, so that the magnetic field applied to the magnetoresistive segment 2*a* from the magnet 3 is accordingly varied. As a result, the resistance value of the magnetoresistive segment 2*a* changes between the time when a tooth 1*a* of the magnetic moving member 1 comes to face the magnetoresistive segment 2*a* and the time when a groove 1*b* of the magnetic moving member 1 comes to face the magnetoresistive segment 2*a*, as illustrated in FIG. 13. Thus, the output of the amplifier circuit 13 also changes accordingly. Then, the output of the amplifier circuit 13 is waveform shaped by means of the comparison circuit 14, so that the output terminal 16 of the processing circuit 20 finally generates a final output signal of "1" or "0" corresponding to a tooth 1*a* or a groove 1*b* of the magnetic moving member 1.

However, the known magnetic detection apparatus as described above has the following problem. That is, as shown in FIGS. 16(*a*) and 16(*b*), when intervals between adjacent teeth 1*a* and the circumferential width of each tooth 1*a* are both small, and when an opposing space (hereinafter called a "GAP") between the circumferential surface of the magnetic moving member 1 and the magnetoresistive segment 2*a* is large, as shown in FIG. 14, there might often arise such a case where a final output signal of "1" or "0" is not obtained from the output terminal 16 of the processing circuit 20, as shown in FIG. 15.

SUMMARY OF THE INVENTION

The present invention is intended to obviate the above-mentioned problem, and has for its object to provide a magnetic detection apparatus which is capable of accurately detecting the rotational position of a magnetic moving member even when the intervals between adjacent teeth formed thereon and the circumferential width of each tooth itself are both small or limited and when an opposing space or distance between the circumferential surface of the magnetic moving member and each magnetoresistive segment is large.

Bearing the above object in mind, the present invention resides in a magnetic detection apparatus which includes: a processing circuit being arranged apart from a magnetic moving member on a plane thereof, the processing circuit including a bridge circuit comprising a first magnetoelectric conversion element and a second magnetoelectric conversion element; and a magnet for applying a magnetic field to the first magnetoelectric conversion element and the second magnetoelectric conversion element and also applying a magnetic field to the magnetic moving member in a direction of an axis of rotation of the magnetic moving member. The second magnetoelectric conversion element is arranged substantially on a center line passing through the center of the magnet on a line in opposition to the magnetic moving member when viewed along the direction of the axis of rotation of the magnetic moving member, so that a differential output can be obtained from the outputs of the first magnetoelectric conversion element and the second magnetoelectric conversion element.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 1(*b*) is a partial plan view of the magnetic detection apparatus of FIG. 1(*a*).

FIG. 1(*c*) is a view showing a pattern of magnetoresistive segments of FIG. 1(*a*).

FIG. 3(*b*) is a partial plan view of the magnetic detection apparatus of FIG. 3(*a*).

FIG. 3(*c*) is a view showing a pattern of magnetoresistive segments of FIG. 3(*a*).

FIG. 6(*b*) is a partial plan view of the magnetic detection apparatus of FIG. 6(*a*).

FIG. 6(*c*) is a view showing a pattern of magnetoresistive segments of FIG. 6(*a*).

FIG. 12 shows operational waveform diagrams of the magnetic detection apparatus according to the seventh embodiment.

FIG. 13(*b*) is a partial plan view of the magnetic detection apparatus in FIG. 13(*a*).

FIG. 15 shows operational waveform diagrams of the magnetic detection apparatus in FIGS. 13(*a*) and 13(*b*).

FIG. 16(*b*) is a partial plan view of the magnetic detection apparatus in FIG. 16(*a*).

DESCRIPTION OF THE PREFERRED EMBODIMENTS

Now, preferred embodiments of the present invention will be described below in detail while referring to the accompanying drawings. The same or corresponding parts of the following preferred embodiments of the present invention as those in the known apparatuses described above will be identified by the same symbols.

Embodiment 1

Figure 1A:
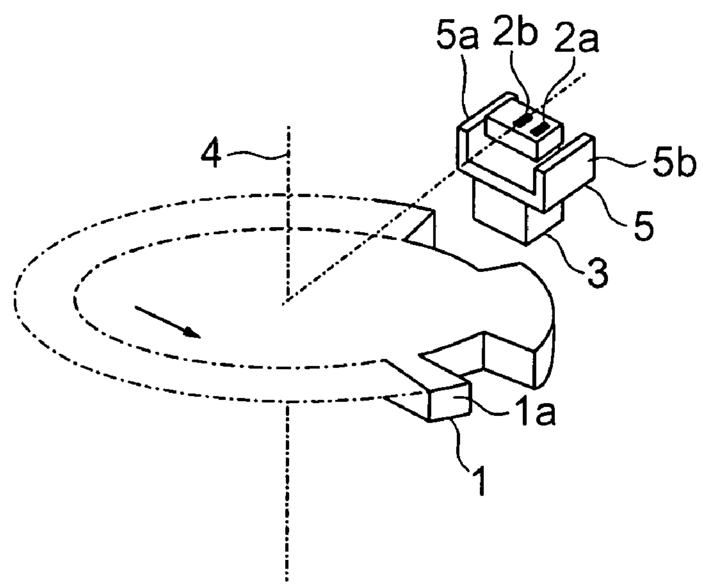
FIG. 1(*a*) is a perspective view of a magnetic detection apparatus according to a first embodiment of the present invention.
Figure 1B:
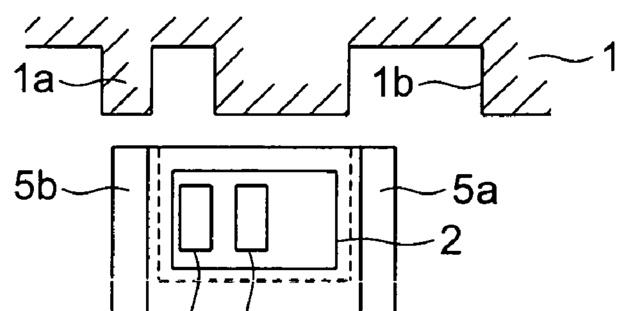
Figure 1C:
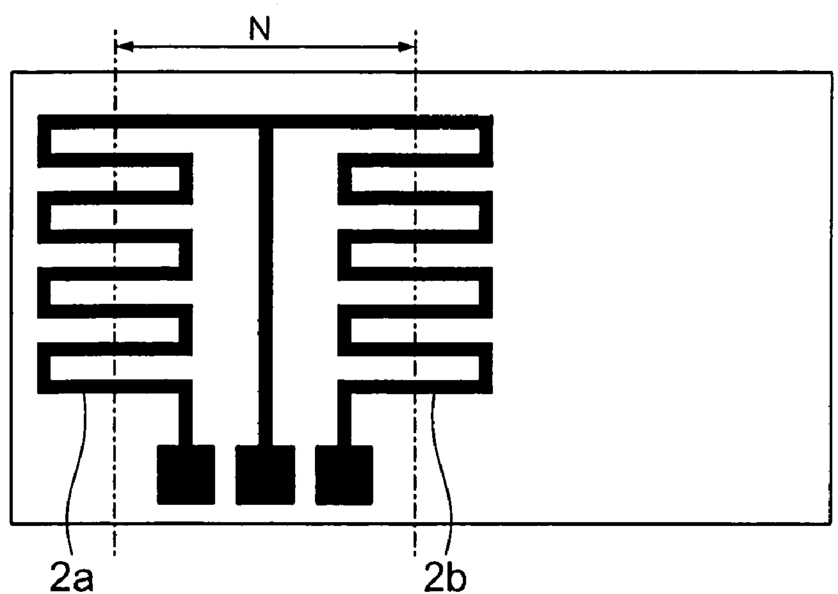

FIG. 1(*a*) is a perspective view of a magnetic detection apparatus according to a first embodiment of the present invention. FIG. 1(*b*) is a partial plan view of the magnetic detection apparatus of FIG. 1(*a*). FIG. 1(*c*) is a view showing a pattern of magnetoresistive segments of FIG. 1(*a*).

As shown in FIGS. 1(*a*) through 1(*c*), the magnetic detection apparatus according to the first embodiment includes a processing circuit 2 being arranged apart from a magnetic moving member 1 on a plane thereof, which is formed on its periphery with convex portions in the form of teeth 1*a* and rotates around an axis of rotation or rotation shaft 4 in a circumferential direction, and having a bridge circuit comprising a first magnetoresistive segment 2*a* and a second magnetoresistive segment 2*b*, which act as magnetoelectric conversion elements, a magnet 3 for applying a magnetic field to the first and second magnetoresistive segments 2*a*, 2*b* as well as applying a magnetic field to the magnetic moving member 1 in a direction of the axis of rotation thereof, and a magnetic guide 5 of a magnetic material arranged between the processing circuit 2 and the magnet 3 for preventing dispersion of a magnetic flux from the magnet 3. The magnetic guide 5 has a pair of projected members 5*a*, 5*b* arranged in a circumferentially spaced and opposed relation with respect to each other. In addition, the processing circuit 2 incorporates therein an amplifier circuit 13, which amplifies a signal whose voltage is varied depending on a change in the resistances of the magnetoresistive segments 2*a*, 2*b*, respectively, a comparison circuit 14 and an output circuit 15 (see FIG. 12).

Note that the bridge circuit is different from the aforementioned known one shown in FIG. 12 in that the fixed resistor 12*b* of the latter is replaced by the second magnetoresistive segment 2*b*.

The first magnetoresistive segment 2*a* is arranged at a side of the second projected member 5*b*, and the second magnetoresistive segment 2*b* is arranged substantially on a widthwise central line passing through the center of the circumferential width of the magnet 3, and substantially on a center line between the pair of first and second projected members 5*a*, 5*b*, when viewed along the direction of the axis of rotation of the magnetic moving member 1.

Figure 2:
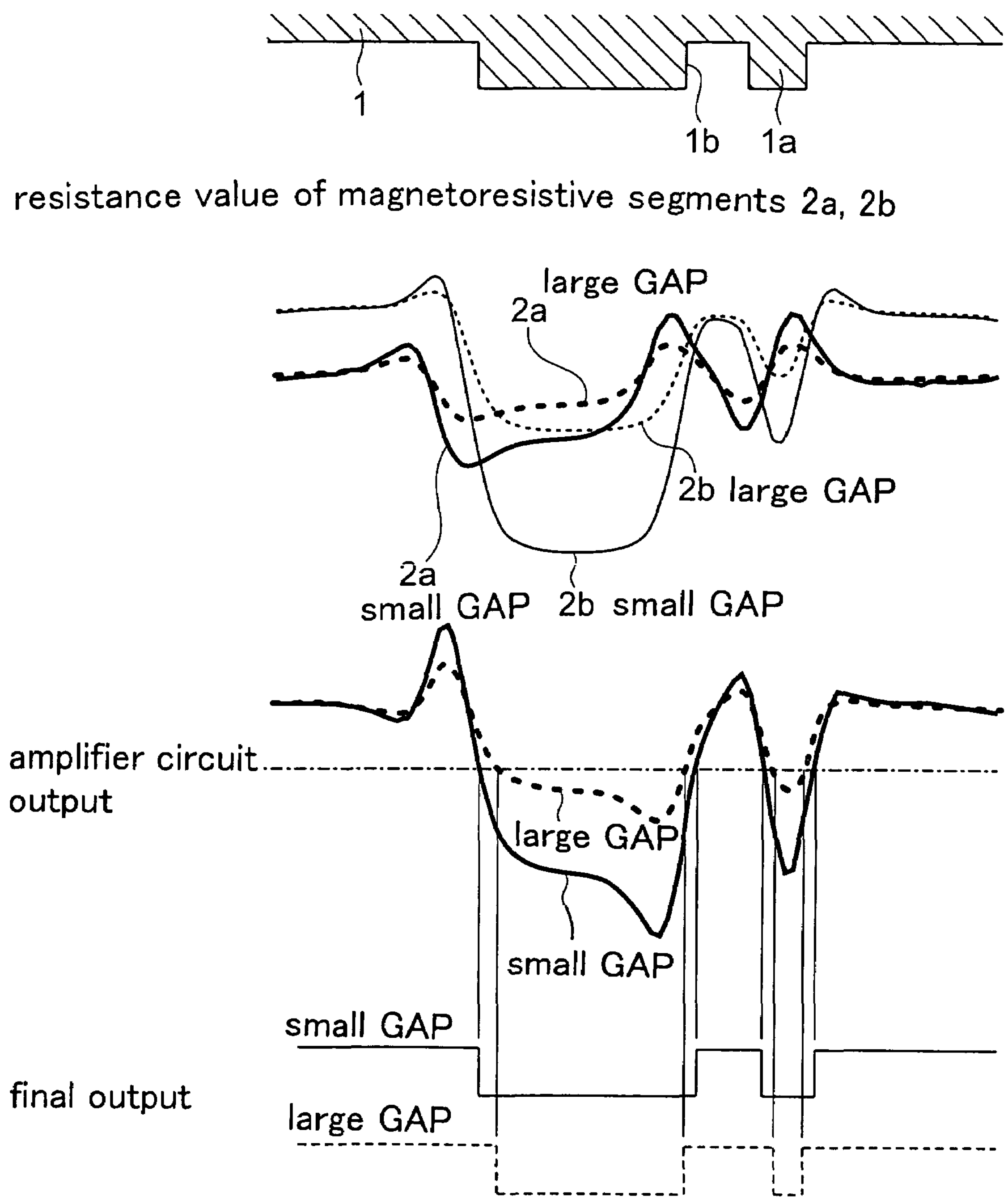
FIG. 2 shows operational waveform diagrams of the magnetic detection apparatus of FIGS. 1(*a*) through FIG. 1(*c*).

With the magnetic detection apparatus as constructed above, the magnetic moving member 1 is caused to rotate in synchronization with the rotation of the rotation shaft 4, so that the magnetic fields applied to the first and second magnetoresistive segments 2*a*, 2*b* from the magnet 3 are accordingly varied. As a result, the resistance value of each of the first and second magnetoresistive segments 2*a*, 2*b* changes between the time when a tooth 1*a* of the magnetic moving member 1 comes to face the first or second magnetoresistive segment 2*a* or 2*b* and the time when a groove 1*b* of the magnetic moving member 1 comes to face the first or second magnetoresistive segment 2*a* or 2*b*, as illustrated in FIG. 2. Thus, the output of the amplifier circuit 13 also changes accordingly. Then, the output of the amplifier circuit 13 is waveform shaped by means of the comparison circuit 14 so that the output terminal 16 of the processing circuit 2 finally generates a final output signal of "1" or "0" corresponding to a tooth 1*a* or a groove 1*b* of the magnetic moving member 1.

In this embodiment, as can be seen from FIG. 2, the intervals between adjacent or successive teeth 1*a* and the circumferential width of each tooth 1*a* are both small or limited, so that a final output signal of "1" or "0" can be obtained from the output terminal 16 of the processing circuit 2 even when opposing spaces or distances GAP between the circumferential surface of the magnetic moving member 1 and each of the magnetoresistive segments 2*a*, 2*b* is large. As a consequence, the position detection accuracy of the magnetic detection apparatus for detecting the rotational position of the magnetic moving member 1 can be improved to a considerable extent.

Embodiment 2

Figure 3A:
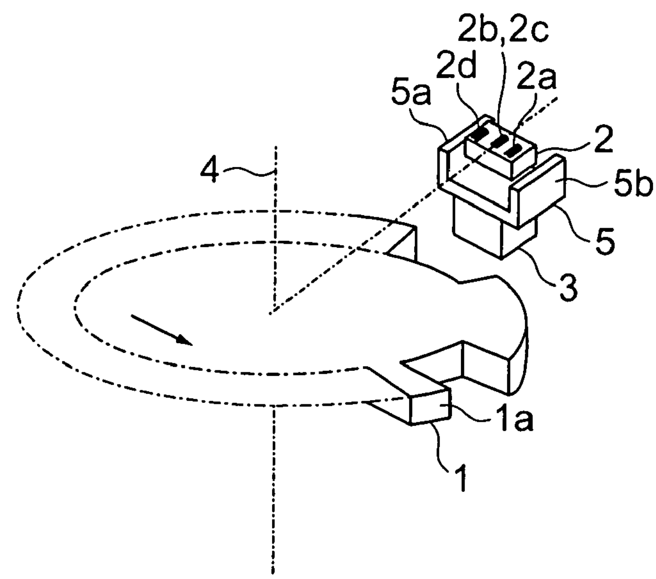
FIG. 3(*a*) is a perspective view of a magnetic detection apparatus according to a second embodiment of the present invention.
Figure 3B:
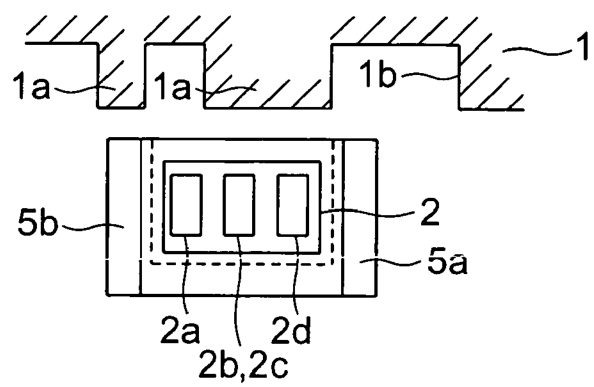
Figure 3C:
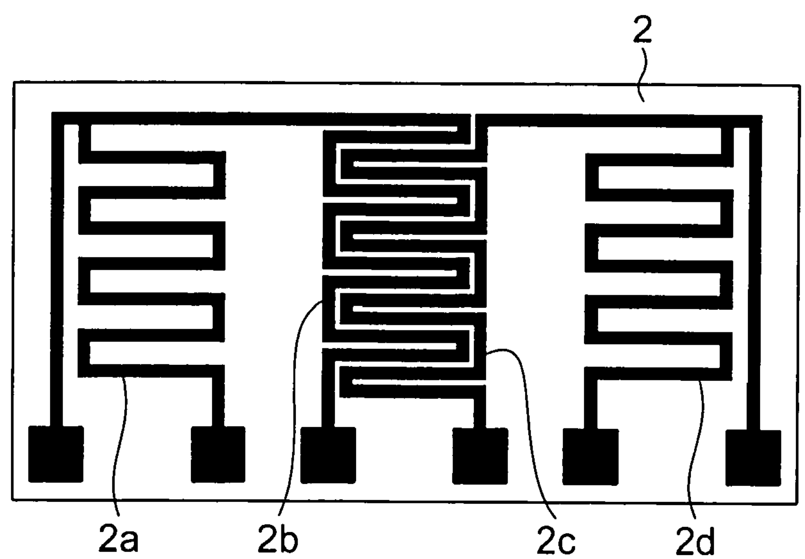

FIG. 3(*a*) is a perspective view showing a magnetic detection apparatus according to a second embodiment of the present invention. FIG. 3(*b*) is a partial plan view of the magnetic detection apparatus of FIG. 3(*a*). FIG. 3(*c*) is a view showing a pattern of magnetoresistive segments of FIG. 3(*a*).

In this second embodiment, as compared with the first embodiment, the processing circuit 2 includes, in addition to the first bridge circuit comprising the first magnetoresistive segment 2a and the second magnetoresistive segment 2b, a second bridge circuit comprising a third magnetoresistive segment 2c and a fourth magnetoresistive segment 2d.

The second magnetoresistive segment 2b and the third magnetoresistive segments 2c are arranged substantially on a widthwise central line passing through the center of the circumferential width of the magnet 3, and substantially on a center line between the pair of first and second projected members 5a, 5b, when viewed along the direction of the axis of rotation of the magnetic moving member 1. The first magnetoresistive segment 2a is arranged on the second projected member 5b side, and the fourth magnetoresistive segment 2d is arranged on the first projected member 5a side.

In addition, a differential output is obtained from a first output at a first midpoint between the first magnetoresistive segment 2a and the second magnetoresistive segment 2b, and from a second output at a second midpoint between the third magnetoresistive segment 2c and the fourth magnetoresistive segment 2d.

Figure 4:
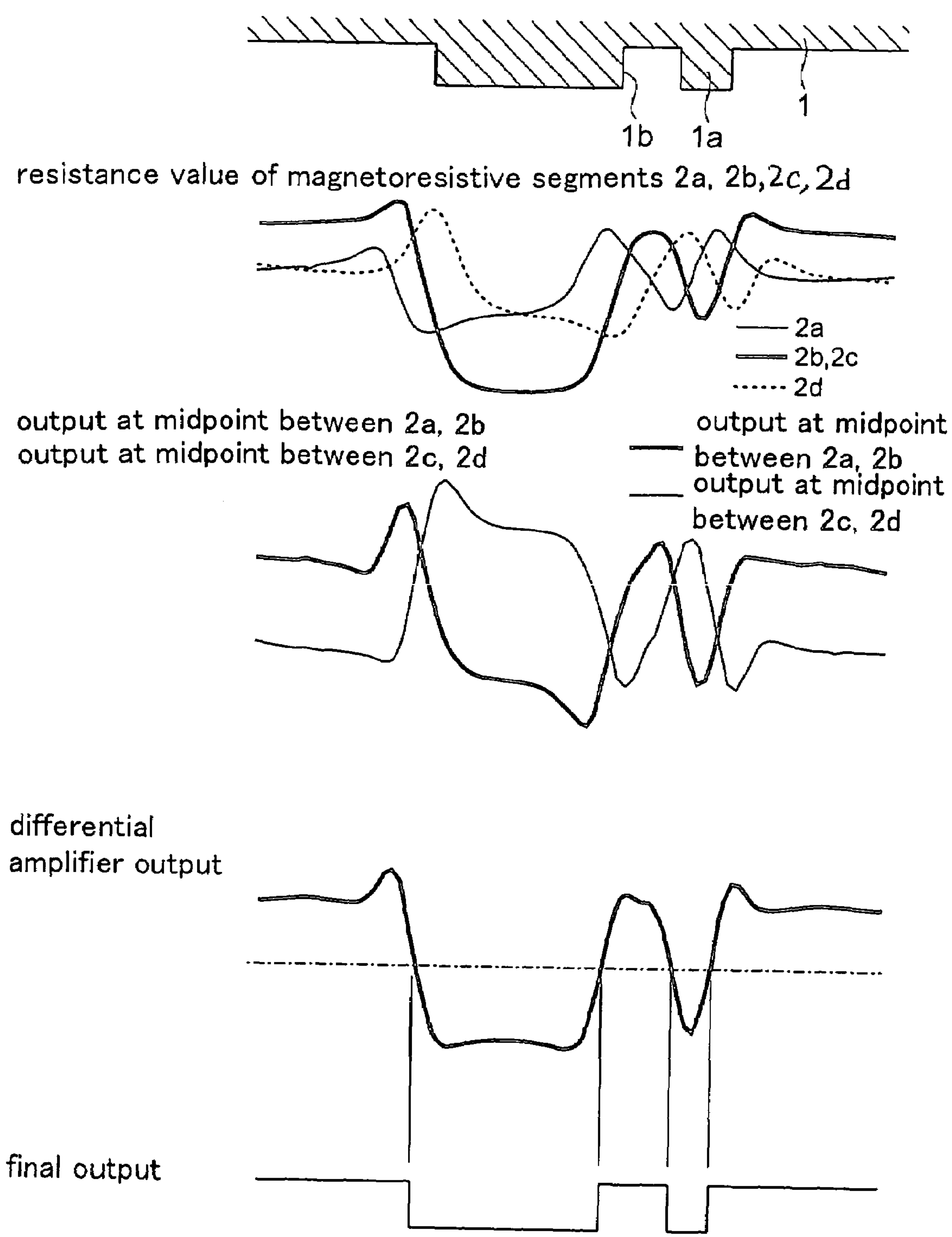
FIG. 4 shows operational waveform diagrams of the magnetic detection apparatus of FIGS. 3(*a*) through 3(*c*).

FIG. 4 shows operational waveform diagrams of the magnetic detection apparatus according to the second embodiment. The resistances of the first through fourth magnetoresistive segments 2a, 2b, 2c and 2d are changed in accordance with the shape (i.e., tooth 1a or groove 1b) of the magnetic moving member 1 so that there is obtained a differential amplification output between the first midpoint output at the first midpoint between the first magnetoresistive segment 2a and the second magnetoresistive segment 2b, and the second output at the second midpoint between the third magnetoresistive segment 2c and the fourth magnetoresistive segment 2d. This differential amplification output is waveform shaped to provide a final output signal of “1” or “0” corresponding to the shape (i.e., tooth 1a or groove 1b) of the magnetic moving member 1.

Figure 5:
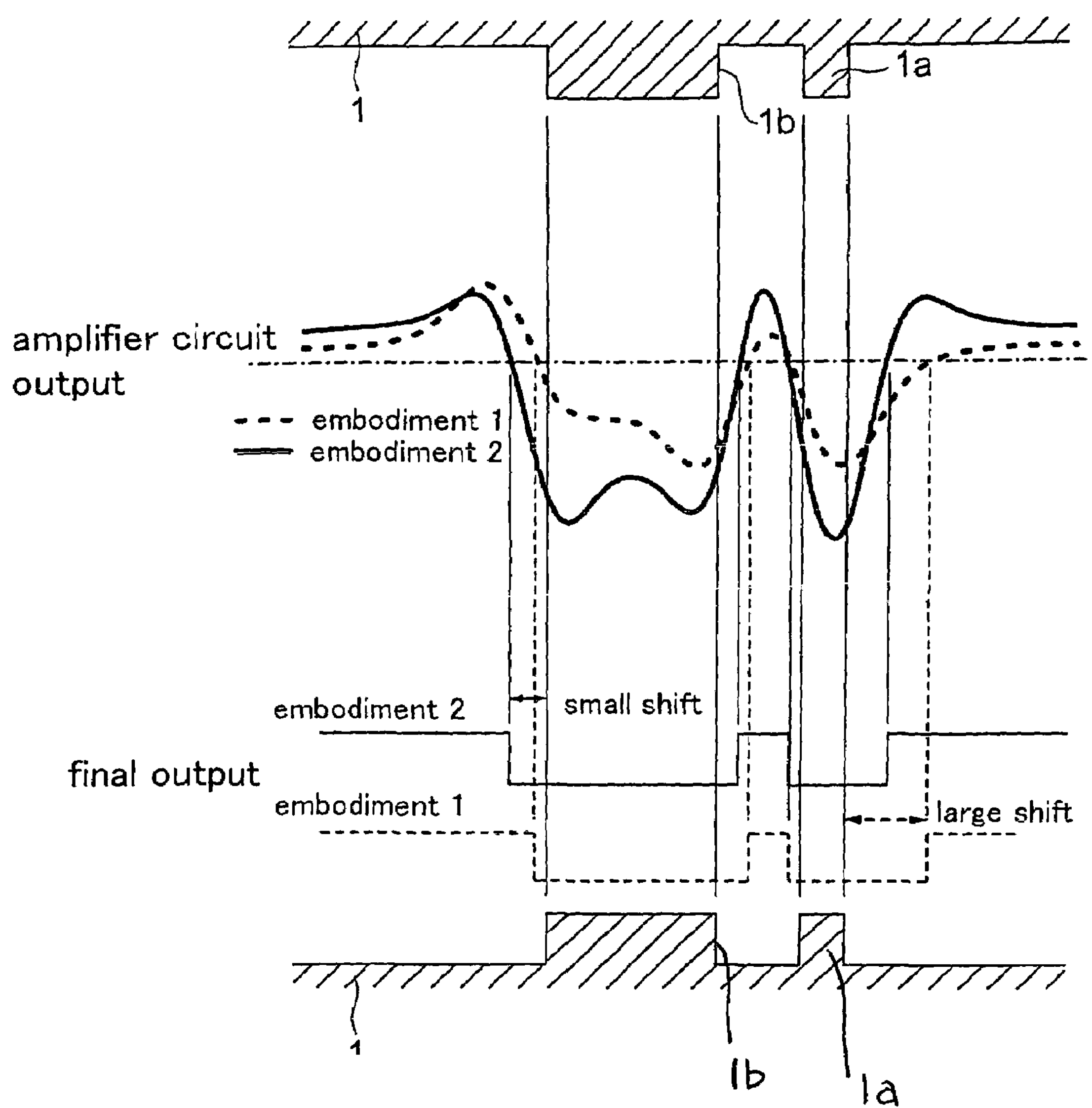
FIG. 5 is a view showing the operational waveform of the magnetic detection apparatus according to the first embodiment and the operational waveform of the magnetic detection apparatus according to the second embodiment overlapped one over the other.

FIG. 5 is a view showing a comparison between the operational waveforms of the magnetic detection apparatuses according to the first and second embodiments. From this figure, it is found that when a comparison is made between points of maximum shifts or deviations of the detection positions in the first and second embodiments, the magnitudes of the maximum shifts or deviations of the detection positions are smaller in the second embodiment than in the first embodiment.

Embodiment 3

Figure 6A:
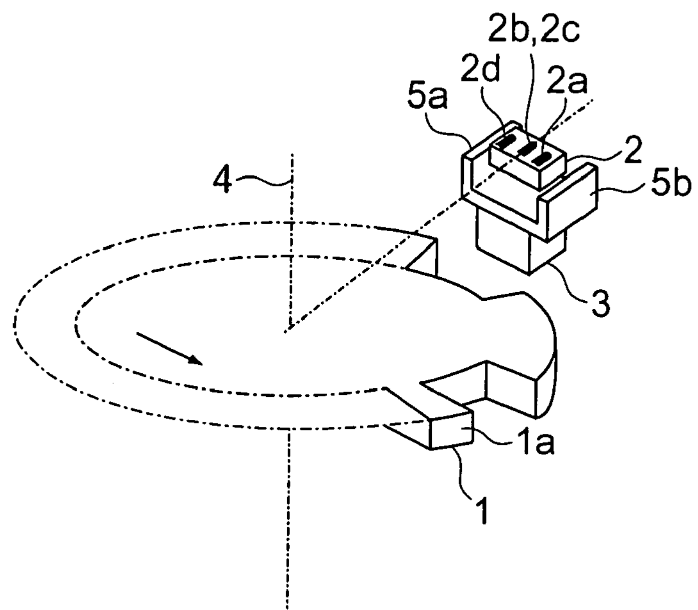
FIG. 6(*a*) is a perspective view of a magnetic detection apparatus according to a third embodiment of the present invention.
Figure 6B:
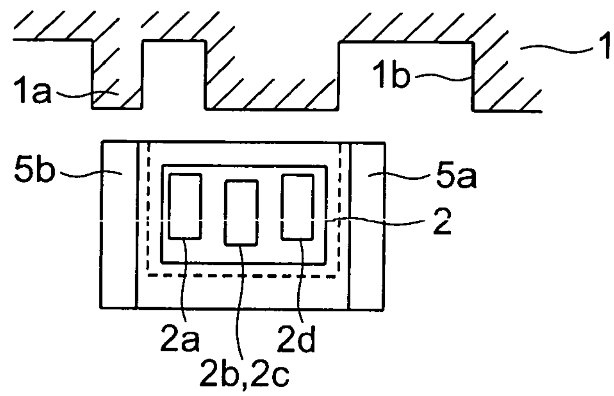
Figure 6C:
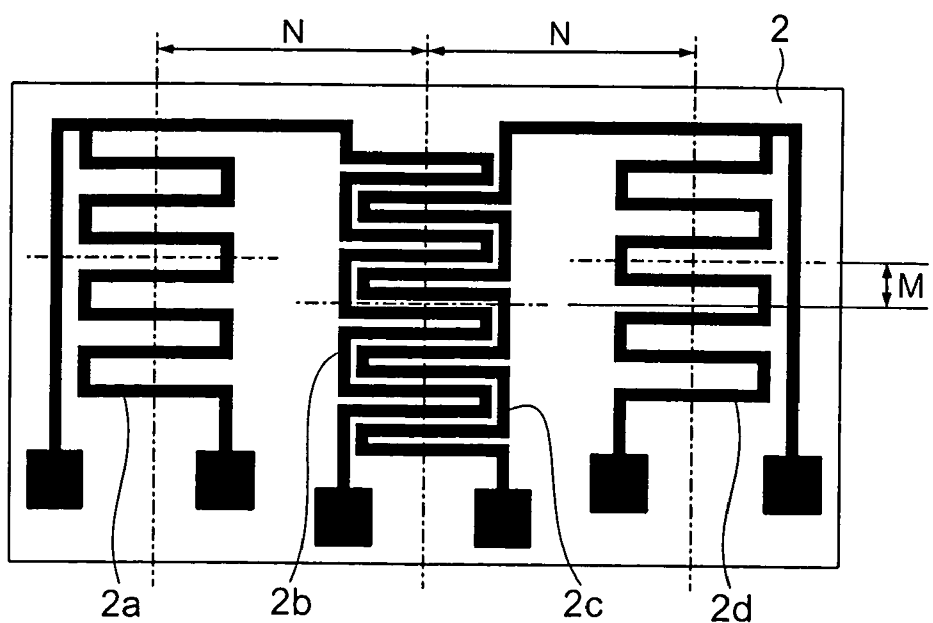

FIG. 6(a) is a perspective view showing a magnetic detection apparatus according to a third embodiment of the present invention. FIG. 6(b) is a partial plan view of the magnetic detection apparatus of FIG. 6(a). FIG. 6(c) is a view showing a pattern of magnetoresistive segments of FIG. 6(a).

In this third embodiment, the opposing distance of the peripheral surface of each tooth 1a to the second magnetoresistive segment 2b and the third magnetoresistive segment 2c is different from the opposing distance of the surface of each tooth 1a to the first magnetoresistive segment 2a and the fourth magnetoresistive segment 2d. The construction of this third embodiment other than the above is similar to that of the second embodiment.

Figure 7:
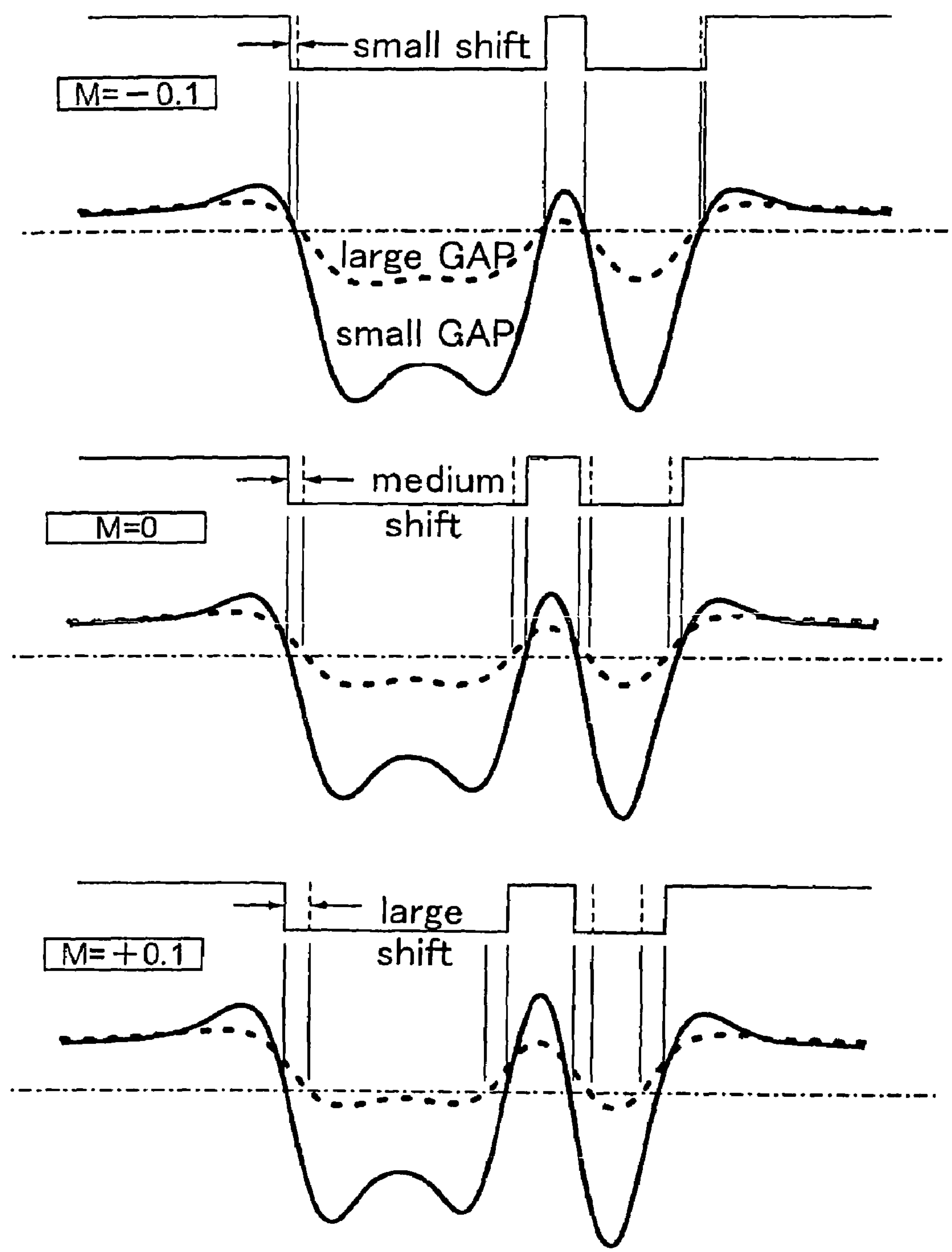
FIG. 7 shows operational waveform diagrams of the magnetic detection apparatus according to the third embodiment.

FIG. 7 shows operational waveform diagrams of the third embodiment when assuming that a difference between the opposing distances is M and the value of M is −0.1 mm, 0 mm and +0.1 mm, respectively, with the opposing distances GAP being large and small, respectively.

From this figure, it is found that the detection shifts or deviations both in large and small distances GAP are smaller when M=−0.1 mm than when M=+0.1 mm.

Thus, by adjusting the above-mentioned M in an appropriate manner, it is possible to suppress reduction in the detection performance of the apparatus which would be generated when the opposing distance GAP is large.

Embodiment 4

A fourth embodiment of the present invention shows an example in which accuracy in the detection of the rotational position of the magnetic moving member 1 can be improved by adjusting a distance or pitch N (see FIG. 6(c)) of the second magnetoresistive segment 2b and the third magnetoresistive segment 2c, which are arranged on the center line between the pair of projected members 5a, 5b, to the first magnetoresistive segment 2a and the fourth magnetoresistive segment 2d, which are arranged in the neighborhood of the projected members 5a, 5b, respectively.

Figure 8:
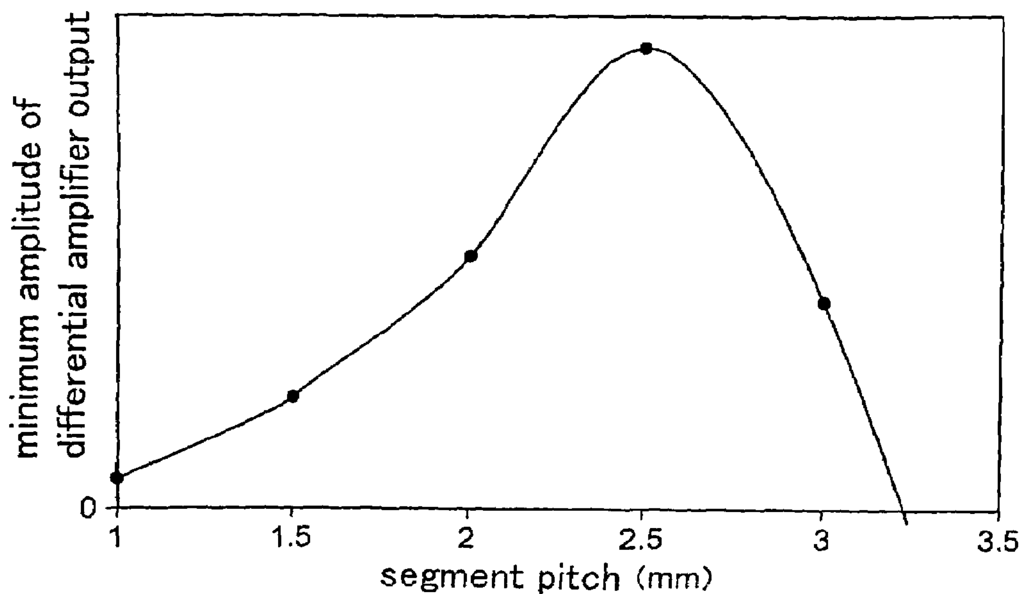
FIG. 8 is a view showing the relation between a segment pitch N and a differential amplification output minimum amplitude in a magnetic detection apparatus according to a fourth embodiment of the present invention.

FIG. 8 is a view showing the relation between the segment pitch N and the minimum amplitude of the differential amplification output in the magnetic detection apparatus according to the fourth embodiment of the present invention. Here, the differential amplification output minimum amplitude means the amplitude of the output voltage of the differential amplifier 13 when a difference between the output voltage of the differential amplifier 13 and a comparison voltage is minimum. The lesser the value of the differential amplification output minimum amplitude, the worse becomes the position detection accuracy. In the example of FIG. 8, when the segment pitch N (i.e., interval between adjacent magnetoresistive segments) is within a range of 1.5 mm–3 mm, a differential amplification output capable of detecting the rotational position of the magnetic moving member 1 can be obtained, thereby ensuring high detection performance.

Embodiment 5

A fifth embodiment of the present invention shows an example in which accuracy in the detection of the rotational position of the magnetic moving member 1 can be improved by adjusting the opposing distance or pitch between the opposed projected members 5a, 5b in relation to the segment pitch N.

Figure 9:
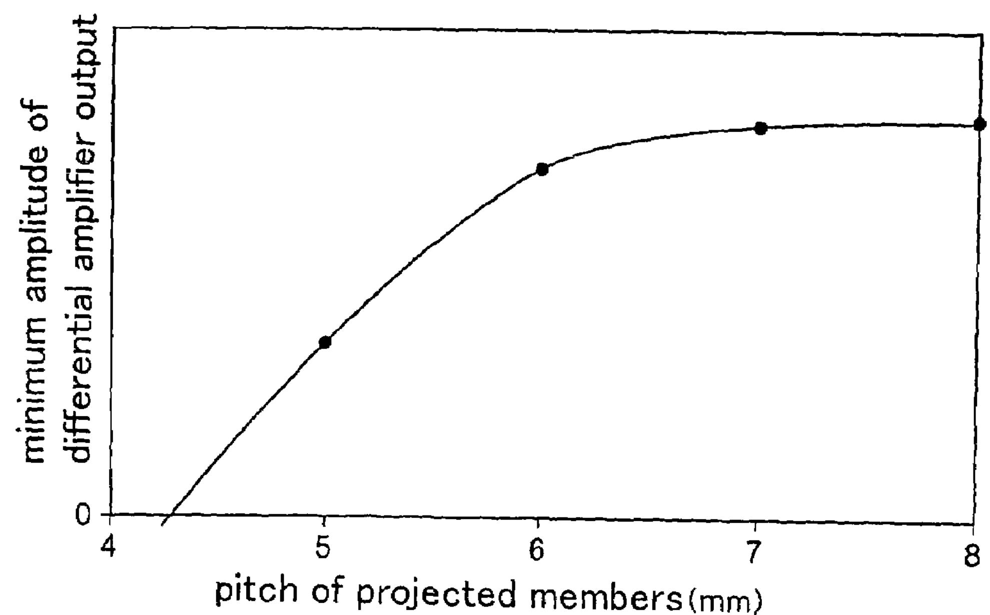
FIG. 9 is a view showing the relation between a pitch of projected members and a differential amplifier output minimum amplitude in a magnetic detection apparatus according to a fifth embodiment of the present invention.

FIG. 9 shows, as an example, the relation between the distance between the projected members 5a, 5b (i.e., the pitch between the projected members) and the minimum amplitude of the differential amplification output when the segment pitch N is 2.5 mm. In the example of FIG. 9, when the pitch of the projected members is 5 mm or more (i.e., twice or more the magnetoresistive segment pitch N), it is possible to obtain an output of the differential amplifier 13 capable of detecting the rotational position of the magnetic moving member 1.

Embodiment 6

A sixth embodiment of the present invention shows an example in which a giant magnetoresistive element (hereinafter simply referred to as a “GMR element”) is used as a magnetic detection element.

The GMR element is a layered or stacked product in the form of a so-called artificial lattice film, which is formed by alternately stacking a plurality of magnetic layers and a plurality of non-magnetic layers each of a thickness of a few angstroms to a few tens of angstroms. (Fe/Cr)n, (permalloy/Cu/Co/Cu)n, and (Co/Cu)n (“n” is the number of stacked layers) are known as GMR elements. The GMR element has an MR effect (MR change rate) far greater than that of a conventional magnetoresistive element (hereinafter referred to as an "MR element"). The MR effect (i.e., the magnetic resistance or reluctance) of the GMR element depends solely on a relative angle included by the directions of magnetization of the adjacent magnetic layers, so that the GMR element has the same change in resistance with respect to the current flowing through the GMR element irrespective of the direction of an external magnetic field applied thereto relative to the direction of flow of the current. However, the GMR element can have magnetic anisotropy by narrowing the width of a magnetoresistive pattern.

Figure 10:
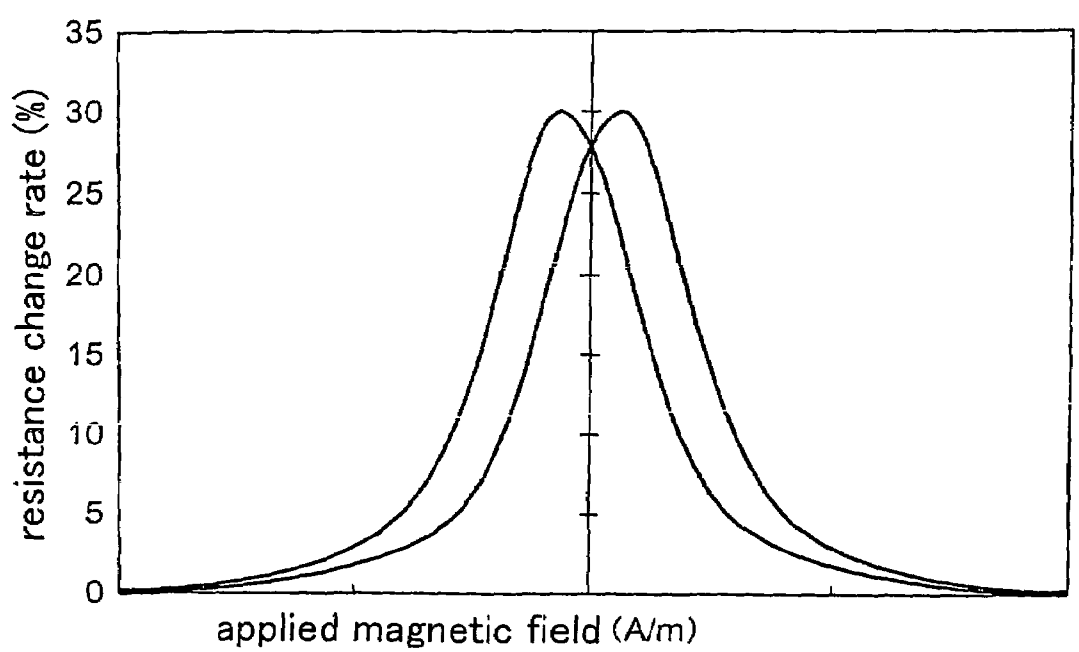
FIG. 10 is a view showing an MR loop characteristic of a GMR element in the magnetic detection apparatus according to s sixth embodiment of the present invention.

Moreover, the GMR element has hysteresis in the change of resistance caused by a change in the magnetic field applied thereto, and it also has a temperature characteristic, especially a large temperature coefficient. An MR loop characteristic of the GMR element is illustrated in FIG. 10.

In this manner, by using the GMR element as a magnetoelectric conversion element, the signal-to-noise ratio (S/N ratio) can be improved, and noise immunity can be increased.

Embodiment 7

Figure 11:
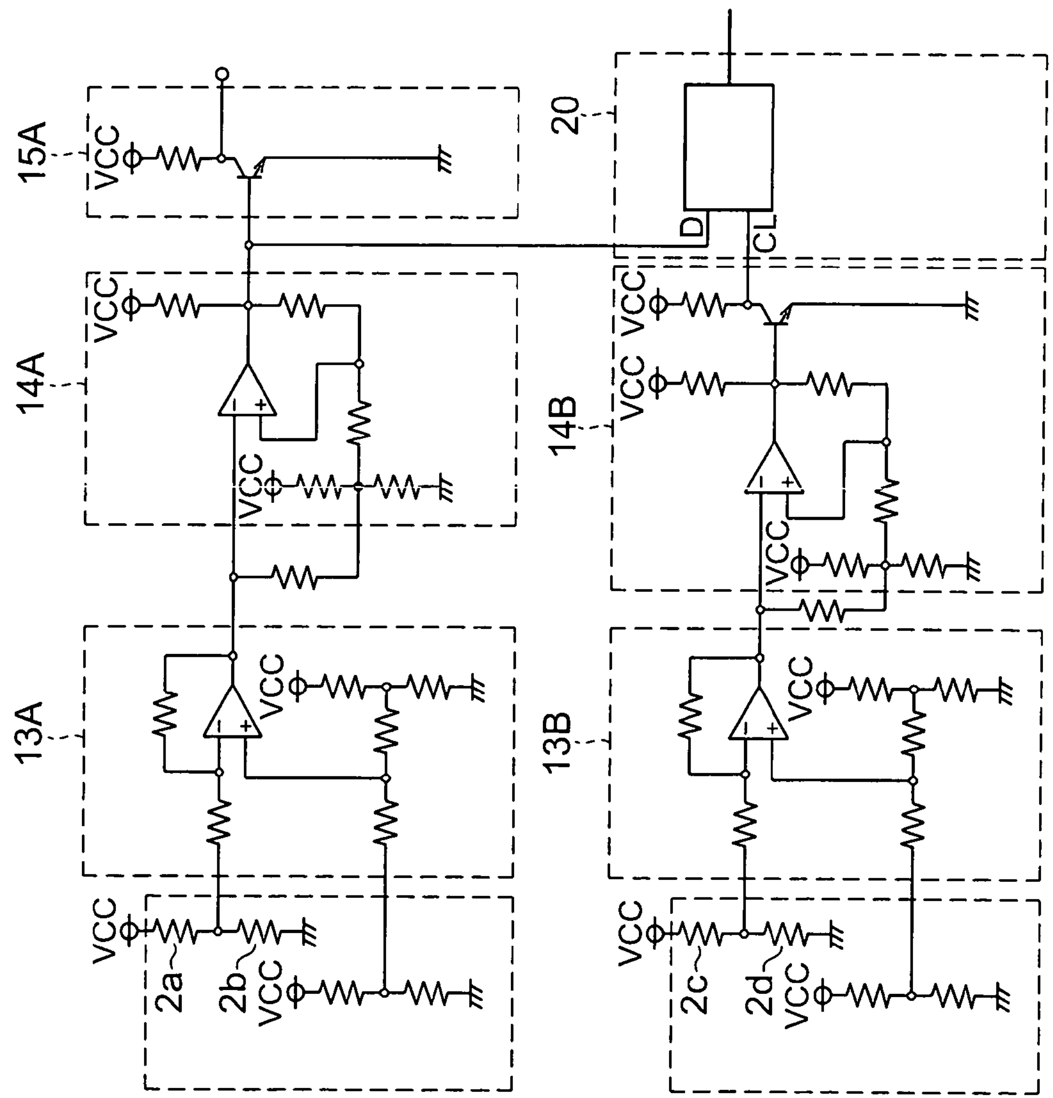
FIG. 11 is an electric circuit diagram of a magnetic detection apparatus according to a seventh embodiment of the present invention.
Figure 13A:
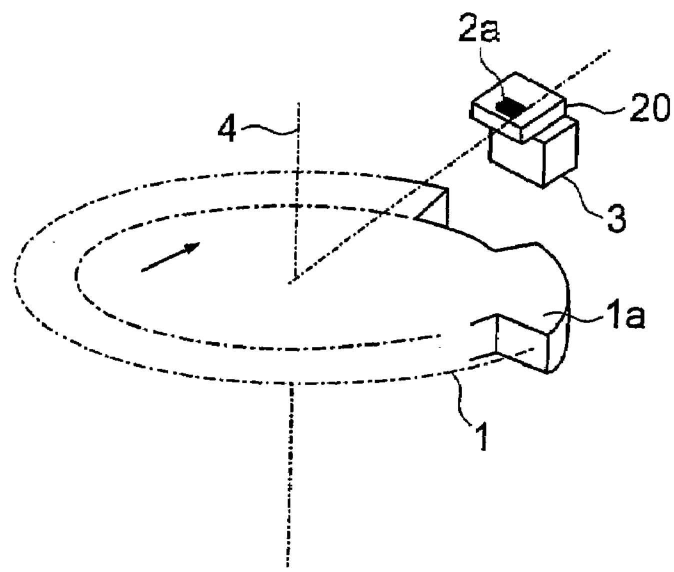
FIG. 13(*a*) is a perspective view of a known magnetic detection apparatus.
Figure 13B:
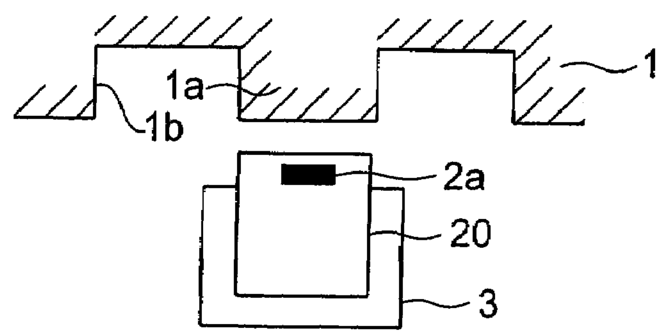
Figure 14:
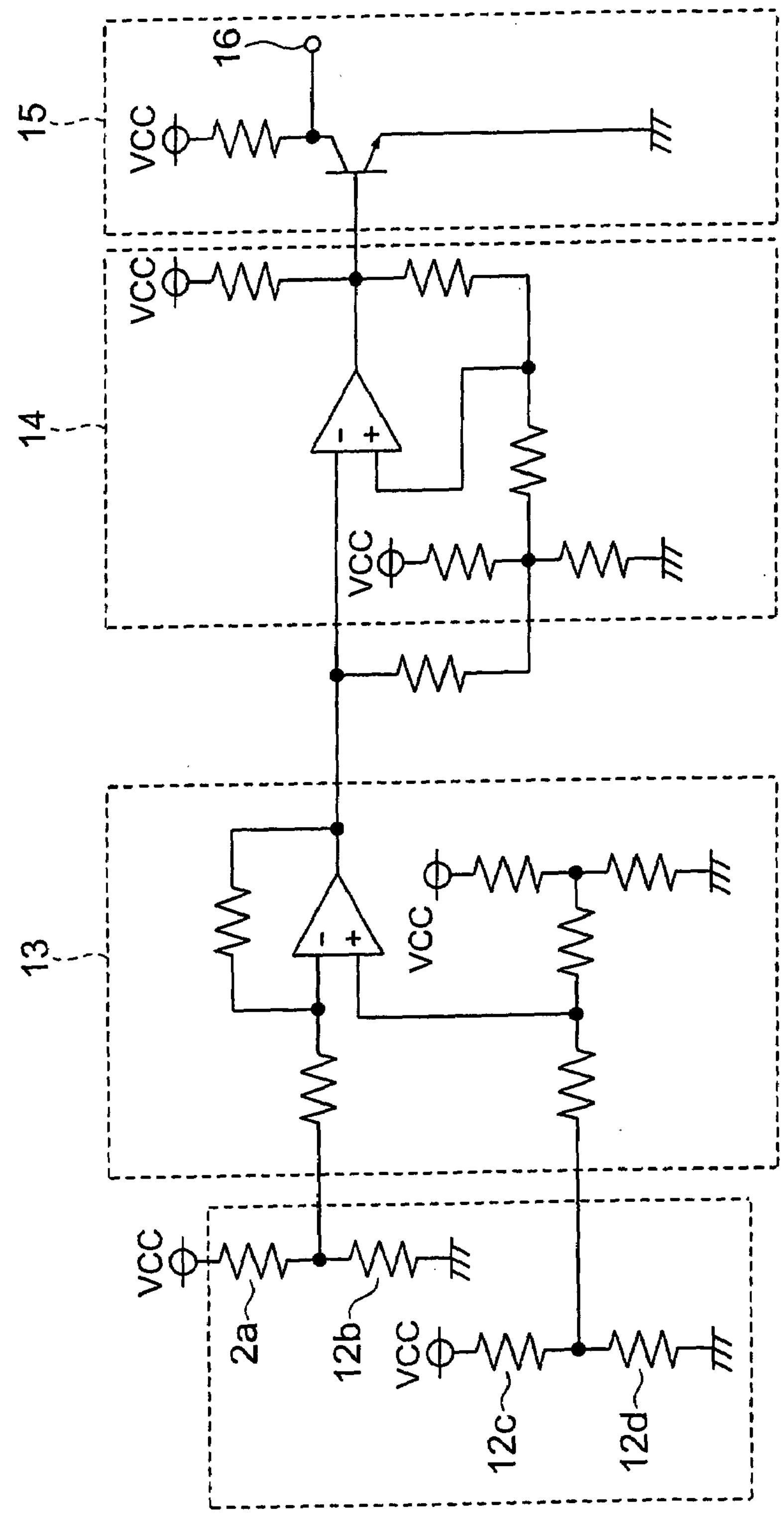
FIG. 14 is an electric circuit diagram of the known magnetic detection apparatus in FIGS. 13(*a*) and 13(*b*).
Figure 16A:
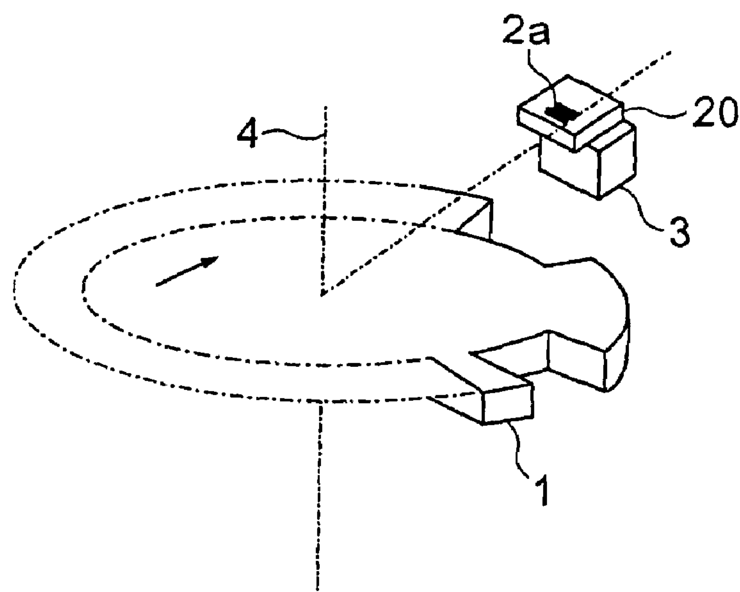
FIG. 16(*a*) is a perspective view of another known magnetic detection apparatus.
Figure 16B:
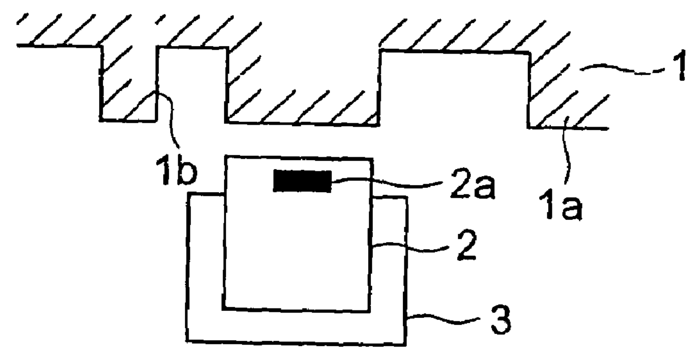
Figure 17:
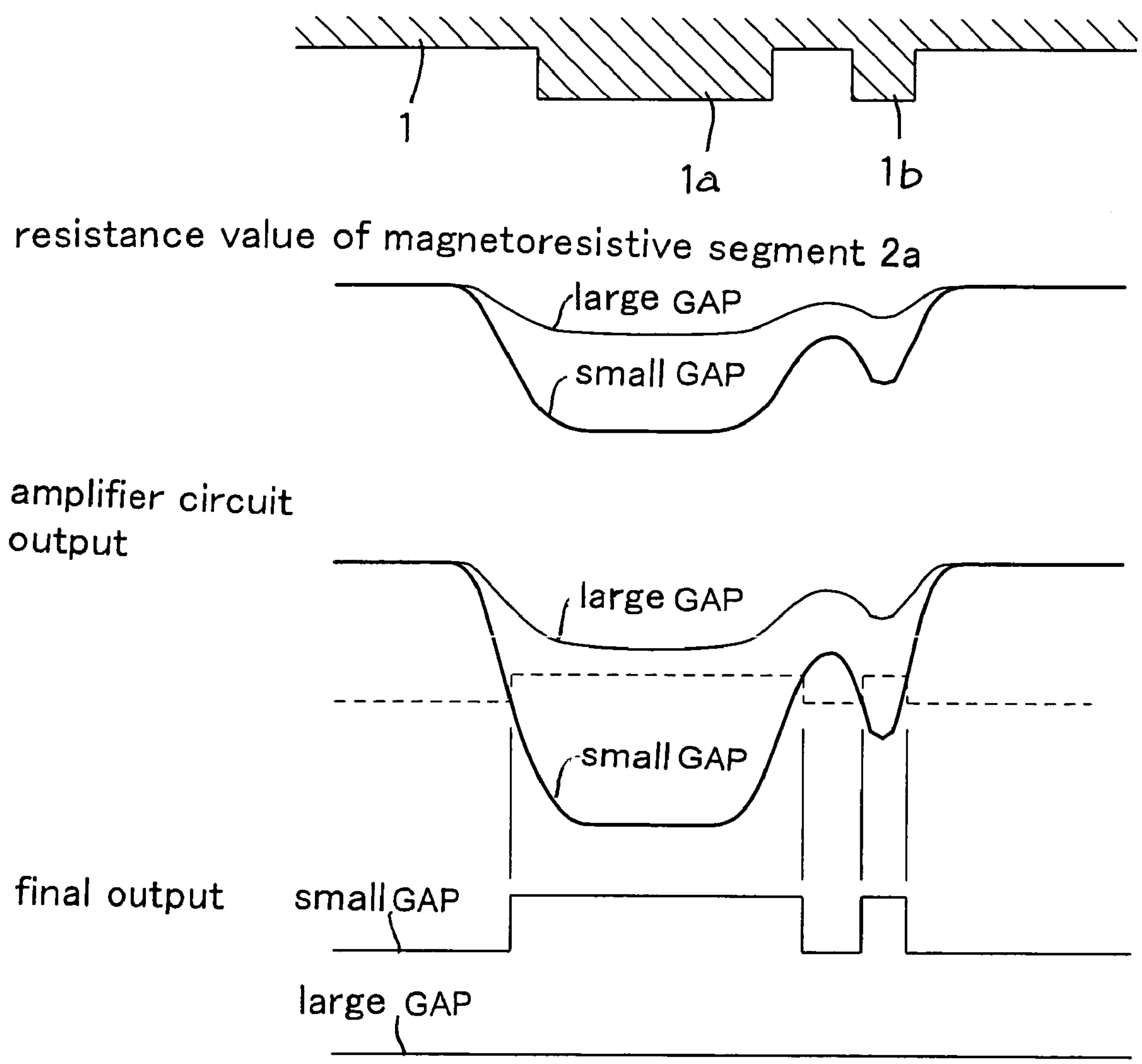
FIG. 17 shows operational waveform diagrams of the magnetic detection apparatus in FIGS. 16(*a*) and 16(*b*).

FIG. 11 shows an electric circuit diagram of a magnetic detection apparatus according to a seventh embodiment, and FIG. 12 shows the operational waveform of this magnetic detection apparatus.

In this embodiment, as compared with the aforementioned second embodiment, a processing circuit 2 further includes a differential flip-flop circuit 20 for detecting the direction of rotation of a magnetic moving object 1 from an output at a midpoint between a first magnetoresistive segment 2*a* and a second magnetoresistive segment 2*b* and an output at a midpoint between a third magnetoresistive segment 2*c* and a fourth magnetoresistive segment 2*d*.

Also, the processing circuit 2 incorporates therein a first differential amplifier circuit 13A for amplifying a signal which is provided by converting a resistance change at a neutral point between the first and second magnetoresistive segments 2*a*, 2*b* into a corresponding voltage change, a first comparison circuit 14A and an output circuit 15. Additionally, the processing circuit 2 further incorporates a second differential amplifier circuit 13B for amplifying a signal which is provided by converting a resistance change at a neutral point between the third and fourth magnetoresistive segments 2*c*, 2*d* into a corresponding voltage change, a second comparison circuit 14B and a differential flip-flop circuit (D-FF) 20.

In this embodiment, the resistance values of the first magnetoresistive segment 2*a* and the second magnetoresistive segment 2*b* are changed in accordance with the configuration of the magnetic moving object 1, whereby the output of the first differential amplifier circuit 13A is accordingly changed. Then, the output of the first differential amplifier circuit 13A is waveform shaped to generate a final output signal which takes a high value of "1" or a low value of "0" corresponding to a tooth 1*a* or a groove 1*b* of the magnetic moving object 1.

Furthermore, similarly, the resistance values of the third magnetoresistive segment 2*c* and the fourth magnetoresistive segment 2*d* are changed in accordance with the configuration of the magnetic moving object 1, whereby the output of the second differential amplifier circuit 13B is accordingly changed. Then, the output of the second differential amplifier circuit 13B is waveform shaped to generate a final output signal which takes a high value of "1" or a low value of "0" corresponding to a tooth 1*a* or a groove 1*b* of the magnetic moving object 1. The output signals from the first and second differential amplifier circuits 13A, 13B are input to the D-FF circuit 20, so that the output of the D-FF circuit 20 becomes low when the magnetic moving object 1 is rotating in the forward direction, and high when the magnetic moving object 1 is rotating in the reverse direction, as a result of which the reverse rotation of the magnetic moving object 1 can be detected.

In addition, although in the above-mentioned embodiments, the magnetic moving member 1 is of a disk shape formed on its periphery with the teeth 1*a* and rotates in its circumferential direction, it is of course not limited to such a shape and operation but may comprise a magnetic moving member capable of performing linear reciprocating motion for example.

In this case, a magnetic field is applied from the magnet to the magnetic moving member in a vertical direction perpendicular to a plane formed by the linear movement of the magnetic moving member, and the first magnetoelectric conversion element is arranged substantially on a center line of the magnet on a line on which it opposes to the magnetic moving member when viewed along the vertical direction.

As described in the foregoing, the present invention provides the following excellent advantages.

According to the present invention, there is provided a magnetic detection apparatus comprising: a processing circuit being arranged apart from a magnetic moving member on a plane thereof, the processing circuit including a bridge circuit comprising a first magnetoelectric conversion element and a second magnetoelectric conversion element; and a magnet for applying a magnetic field to the first magnetoelectric conversion element and the second magnetoelectric conversion element and also applying a magnetic field to the magnetic moving member in a direction of an axis of rotation of the magnetic moving member. The second magnetoelectric conversion element is arranged substantially on a center line passing through the center of the magnet on a line in opposition to the magnetic moving member when viewed along the direction of the axis of rotation of the magnetic moving member, so that a differential output can be obtained from the outputs of the first magnetoelectric conversion element and the second magnetoelectric conversion element. With the above arrangement, it is possible to achieve excellent detection performance even when the intervals between adjacent convex portions and the width in a direction of movement of each convex portion itself are small and when an opposing space or distance GAP between the first and second magnetoelectric conversion elements and the magnetic moving member is large.

What is claimed is:

1. A magnetic detection apparatus comprising:

a processing circuit being arranged apart from a magnetic moving member on a plane thereof, said processing circuit including a bridge circuit comprising a first magnetoelectric conversion element and a second maanetoelectric conversion element; and a magnet for applying a magnetic field to said first magnetoelectric conversion element and said second magnetoelectric conversion element and also applying a magnetic field to said magnetic moving member in a direction of an axis of rotation of said magnetic moving member;

wherein said second magnetoelectric conversion element is arranged substantially on a center line passing through the center of said magnet on a line in opposition to said magnetic moving member when viewed along the direction of the axis of rotation of said magnetic moving member, so that a differential output can be obtained from the outputs of said first magnetoelectric conversion element and said second magnetoelectric conversion element;

wherein said magnetic moving member comprises a disk-shaped member having teeth formed on its periphery and being movable in a circumferential direction thereof, and further comprising a magnetic guide arranged between said processing circuit and said magnet and having a pair of projected members in an opposed and spaced relation with respect to each other in the circumferential direction of said magnetic moving member, wherein said second magnetoelectric conversion element is arranged substantially on a center line between said pair of projected members, and said first magnetoelectric conversion element is arranged on a side of one of said pair of projected members.

2. The magnetic detection apparatus according to claim 1, wherein said processing circuit further includes a bridge circuit comprising a third magnetoelectric conversion element and a fourth magnetoelectric conversion element, said third magnetoelectric conversion element being arranged substantially on a center line between said pair of projected members, said fourth magnetoelectric conversion element being arranged on a side of the other one of said pair of projected members, so that a differential output is obtained from an output at a midpoint between said first magnetoelectric conversion element and said second magnetoelectric conversion element and from an output at a midpoint between said third magnetoelectric conversion element and said fourth magnetoelectric conversion element.

3. The magnetic detection apparatus according to claim 2, wherein an opposing distance of a peripheral surface of each of said teeth to said first magnetoelectric conversion element and said fourth magnetoelectric conversion element is adjusted in relation to an opposing distance of the peripheral surface of each of said teeth to said second magnetoelectric conversion element and said third magnetoelectric conversion element.

4. The magnetic detection apparatus according to claim 3, wherein the opposing distance of a peripheral surface of each of said teeth to said first magnetoelectric conversion element and said further magnetoelectric conversion element is larger than the opposing distance of the peripheral surface of each of said teeth to said second magnetoelectric conversion element and said third magnetoelectric conversion element.

5. The magnetic detection apparatus according to claim 4, wherein the opposing distance of a peripheral surface of each of said teeth to said first magnetoelectric conversion element and said further magnetoelectric conversion element is larger, by 0.1 mm, than the opposing distance of the peripheral surface of each of said teeth to said second magnetoelectric conversion element and said third magnetoelectric conversion element.

6. The magnetic detection apparatus according to claim 2, wherein a circumferential distance between said first magnetoelectric conversion element and said second magnetoelectric conversion element is adjusted in relation to a circumferential distance between said third magnetoelectric conversion element and said fourth magnetoelectric conversion element.

7. The magnetic detection apparatus according to claim 6, wherein the distance between said first magnetoelectric conversion element and said second magneto electric conversion element, as well as the distance between said third magnetoelectric conversion element and said further magnetoelectric conversion element, is within a range of 1.5 mm to 3 mm.

8. The magnetic detection apparatus according to claim 2, wherein an opposing distance between said opposed projected members is adjusted in relation to a circumferential distance between said first magnetoelectric conversion element and said second magnetoelectric conversion element and a circumferential distance between said third magnetoelectric conversion element and said fourth magnetoelectric conversion element.

9. The magnetic detection apparatus according to claim 2, wherein said processing circuit further includes a differential flip-flop circuit for detecting the direction of rotation of said magnetic moving object from an output at a midpoint between said first magnetoelectric conversion element and said second magnetoelectric conversion element and an output at a midpoint between said third magnetoelectric conversion element and said fourth magnetoelectric conversion element.

10. The magnetic detection apparatus according to claim 1, wherein each of said first and second magnetoelectric conversion elements comprises a giant magnetoresistive element (GMR element).

11. A magnetic detection apparatus comprising:

a processing circuit being arranged apart from a magnetic moving member on a plane thereof, said processing circuit including a bridge circuit comprising a first magnetoelectric conversion element and a second magnetoelectric conversion element; and a magnet for applying a magnetic field to said first magnetoelectric conversion element and said second magnetoelectric conversion element and also applying a magnetic field to said magnetic moving member in a direction of an axis of rotation of said magnetic moving member;

wherein said second magnetoelectric conversion element is arranged substantially on a center line passing through the center of said magnet on a line in opposition to said magnetic moving member when viewed along the direction of the axis of rotation of said magnetic moving member, so that a differential output can be obtained from the outputs of said first magnetoelectric conversion element and said second magnetoelectric conversion element, wherein said processing circuit further includes a bridge circuit comprising a third magnetoelectric conversion element and a fourth magnetoelectric conversion element, said third magnetoelectric conversion element is arranged substantially on the center line passing through the center of said magnet, said fourth magnetoelectric conversion element being arranged on a side of the center line opposite that on which the first magnetoelectric conversion element is disposed, so that a differential output is obtained from an output at a midpoint between said first magnetoelectric conversion element and said second magnetoelectric conversion element and from an output at a midpoint between said third magnetoelectric conversion element and said fourth magnetoelectric conversion element, wherein an opposing distance of a peripheral surface of each of said teeth to said first magnetoelectric conversion element and said fourth magnetoelectric conversion element is adjusted in relation to an opposing distance of the peripheral surface of each of said teeth to said second magnetoelectric conversion element and said third magnetoelectric conversion element.

12. The magnetic detection apparatus according to claim 11, wherein the opposing distance of a peripheral surface of each of said teeth to said first magnetoelectric conversion element and said further magnetoelectric conversion element is larger than the opposing distance of the peripheral surface of each of said teeth to said second magnetoelectric conversion element and said third magnetoelectric conversion element.

13. The magnetic detection apparatus according to claim 12, wherein the opposing distance of a peripheral surface of each of said teeth to said first magnetoelectric conversion element and said further magnetoelectric conversion element is larger, by 0.1 mm, than the opposing distance of the peripheral surface of each of said teeth to said second magnetoelectric conversion element and said third magnetoelectric conversion element.

14. A magnetic detection apparatus comprising:

a processing circuit being arranged apart from a magnetic moving member on a plane thereof, said processing circuit including a bridge circuit comprising a first magnetoelectric conversion element and a second magnetoelectric conversion element; and a magnet for applying a magnetic field to said first magnetoelectric conversion element and said second magnetoelectric conversion element and also applying a magnetic field to said magnetic moving member in a direction of an axis of rotation of said magnetic moving member;

wherein said second magnetoelectric conversion element is arranged substantially on a center line passing through the center of said magnet on a line in opposition to said magnetic moving member when viewed along the direction of the axis of rotation of said magnetic moving member, so that a differential output can be obtained from the outputs of said first magnetoelectric conversion element and said second magnetoelectric conversion element, wherein said processing circuit further includes a bridge circuit comprising a third magnetoelectric conversion element and a fourth magnetoelectric conversion element, said third magnetoelectric conversion element is arranged substantially on the center line passing through the center of said magnet, said fourth magnetoelectric conversion element being arranged on a side of the center line opposite that on which the first magnetoelectric conversion element is disposed, so that a differential output is obtained from an output at a midpoint between said first magnetoelectric conversion element and said second magnetoelectric conversion element and from an output at a midpoint between said third magnetoelectric conversion element and said fourth magnetoelectric conversion element, wherein a circumferential distance between said first magnetoelectric conversion element and said second magnetoelectric conversion element is adjusted in relation to a circumferential distance between said third magnetoelectric conversion element and said fourth magnetoelectric conversion element.

15. The magnetic detection apparatus according to claim 14, wherein the distance between said first magnetoelectric conversion element and said second magneto electric conversion element, as well as the distance between said third magnetoelectric conversion element and said fourth magnetoelectric conversion element, is within a range of 1.5 mm to 3 mm.

* * * * *